United States Patent [19]
Caruso

[11] Patent Number: 5,298,814
[45] Date of Patent: Mar. 29, 1994

[54] ACTIVE ANALOG AVERAGING CIRCUIT AND ADC USING SAME

[75] Inventor: John Caruso, Fremont, Calif.

[73] Assignee: Micro Power Systems, Inc., Santa Clara, Calif.

[21] Appl. No.: 931,739

[22] Filed: Aug. 18, 1992

[51] Int. Cl.$^5$ .............................................. H03F 3/45
[52] U.S. Cl. .................................. 307/529; 307/360; 307/493
[58] Field of Search ............... 307/493, 529, 261, 243, 307/360

[56] References Cited

U.S. PATENT DOCUMENTS

| | | | |
|---|---|---|---|
| 3,917,961 | 11/1975 | Reed | 307/243 |
| 3,932,816 | 1/1976 | MacGregor | 307/243 |
| 3,965,459 | 6/1976 | Spencer et al. | 307/243 |
| 4,038,564 | 7/1977 | Hakata | 307/243 |
| 4,204,131 | 5/1980 | Dozzer | 307/243 |
| 5,021,730 | 6/1991 | Smith | 307/261 |
| 5,107,149 | 4/1992 | Platt et al. | 307/529 |
| 5,140,591 | 8/1992 | Palara et al. | 307/261 |
| 5,185,538 | 2/1993 | Kondoh et al. | 307/493 |

OTHER PUBLICATIONS

Van De Grift et al., "An 8-bit Video ADC Incorporating Folding and Interpolation Techniques," IEEE Journal of Solid-State Circuits, vol. SC-22, No. 6, Dec. 1987, pp. 944-953.

Narin et al., "Current-Mode Algorithmic Analog-to-Digital Converters," IEEE Journal of Solid-State Circuits, vol. 25, No. 4, Aug. 1990, pp. 997-1003.

Yukawa, "A CMOS 8-bit High-Speed A/D Converter IC," IEEE Journal of Solid-State Circuits, vol. SC-20, 1985, pp. 775-779.

Schultz et al., "Ganged CMOS: Trading Standby Power for Speed," IEEE Journal of Solid-State Circuits, vol. 25, No. 3, Jun. 1990, pp. 870-873.

Goodenough, "Interpolators Put 10-Bit .75 MHz A-D Converters on 8-bit Digital Process," Electronic Design, Dec. 14, 1989, pp. 29-30.

Gordon, "Linear Electronic Analog/Digital Conversion Architectures...," IEEE Transactions on Circuits and Systems, vol. CAS-25, No. 7, Jul. 1978.

*Primary Examiner*—John T. Kwon
*Attorney, Agent, or Firm*—Townsend and Townsend Khourie and Crew

[57] ABSTRACT

An analog voltage averaging circuit using active devices increases speed and resolution in analog to digital converters. The analog to digital converters combine the concepts of residue amplification and averaging to simplify the circuit implementation of high order, high speed analog to digital converters.

19 Claims, 7 Drawing Sheets

ACTIVE ANALOG AVERAGING CIRCUIT AND ADC USING SAME

BACKGROUND OF THE INVENTION

This invention relates generally to averaging circuits for analog values, and more particularly the invention relates to an active averaging circuit and to an analog to digital converter (ADC) using same.

Conventional high speed, high resolution analog to digital (A/D) converters have used either a full flash or half flash implementation in either CMOS or ECL circuits. The full flash implementation uses $2^{N-1}$ independent comparators and $2^N$ precision voltage taps to perform a conversion. This type of converter consumes both large amounts of silicon area and power. The half flash implementation uses a two-step, subranging approach to perform a conversion. During the first cycle an M-bit conversion is performed and stored. The data from the first (coarse) conversion is used to determine a subrange for the second N bit conversion. After the completion of the second (fine) conversion, the data from both conversions are combined to give an (M+N)-bit code. This implementation reduces the comparator count to $2^{M-1}+2^{N-1}$ which reduces silicon area and power consumption at the expense of lower speed and increased design complexity.

Both the full flash and half flash architectures have several limitations which prevent them from achieving extremely fast and high resolution conversions. They both carry a tremendous amount of redundant information through each conversion cycle since each discrete voltage reference tap has a single, independent comparator associated therewith. Both architectures rely on an extremely large, accurate resistor string to set the discrete reference tap voltages. CMOS implementations generally use a sampling, auto balanced comparator which gives excellent matching, but due to the large number of independent comparators the CMOS implementation sends large, high speed current spikes to both the analog input and the reference taps. These large dynamic transient signals cause severe problems for the user in driving the analog input and quieting the reference ladder taps. The severity of these transient signals is directly proportional to the number of independent comparators. In order to achieve higher speed, higher resolution converters, designers have generally relied upon advances in processing technology using the same design architectures.

SUMMARY OF THE INVENTION

The present invention is directed to a current or voltage averaging circuit which employs active transconductor devices, for example a pair of CMOS inverters having a common drain as an output, a first input connected to the gates of one inverter, a second input connected to the gates of the other inverter, and with the inverters operating in a linear gain range.

The active analog averaging circuit can be employed in an analog to digital converter employing residue amplification to provide an improved high order, high speed device.

The invention and objects and features thereof will be more readily apparent from the following detailed description and appended claims when taken with the drawing.

DETAILED DESCRIPTION OF ILLUSTRATIVE EMBODIMENTS

Figure 1A:
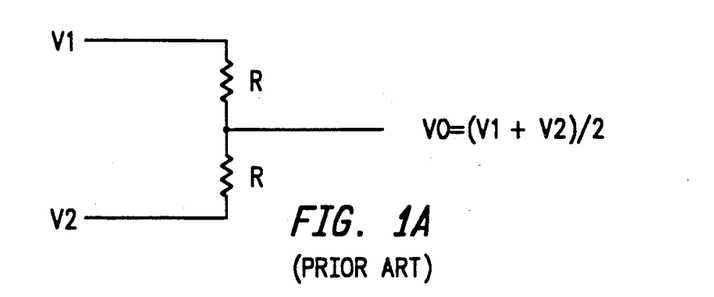
FIGS. 1A and 1B illustrate conventional analog averaging circuits using passive devices.
Figure 1B:
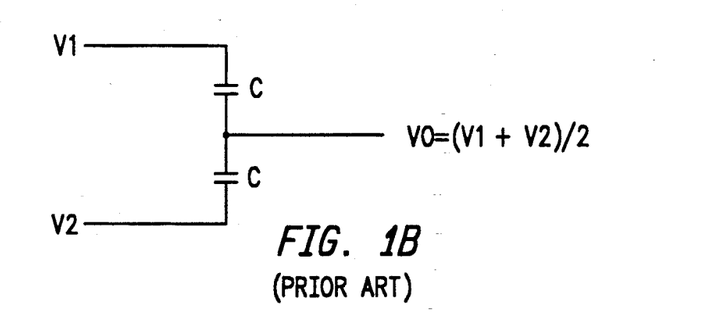

Referring now to the drawings, FIGS. 1A, 1B are schematics of conventional analog averaging circuits using passive devices. In FIG. 1A, two resistors, R1 and R2, are serially connected between the two input signals, V1 and V2. Assuming that R1=R2, the output V0 taken at the common terminal of the two resistors is the average of the two input signals or $$V0=[(V1+V2)/2].$$

Similarly, as shown in FIG. 1B two capacitors C1 and C2 can be serially connected between the two input signals, V1 and V2. Again, assuming that C1=C2, the output taken at the common terminal of the two capacitors is an average of the two input voltages or $$V0=[(V1+V2)/2]$$

It will be appreciated that the averaging of the input voltages can be weighted in favor of either voltage by changing the values of the passive components in the circuit. However, in CMOS integrated circuits accurate resistors and/or capacitors may not be available. Diffused resistors must be large to match well and both diffused resistors and MOS capacitors have large voltage coefficients.

Figure 2:
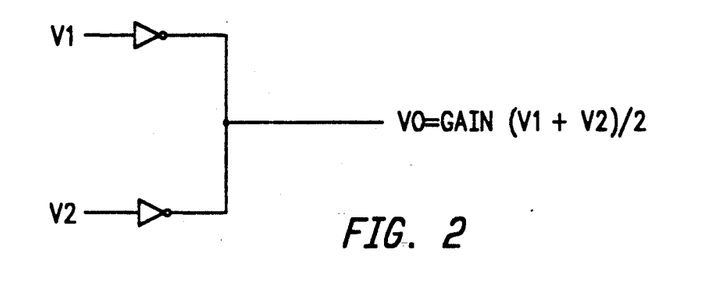
FIG. 2 illustrates an analog averaging circuit employing active components in accordance with the invention.

FIG. 2 illustrates an analog averaging circuit employing active components in accordance with the invention. Two active devices, inverters in this embodiment, have inputs for receiving the two input voltages, V1 and V2, with the outputs connected to provide a gained average of the two input signals. Assuming that the two inverters have amplification of A1 and A2, the average weighted output voltage is given by $$V0=(V1\cdot A1+A2\cdot A2)/2$$

If the amplification of the inverters, A1 and A2, are equal, the output will be the gained average of the two input voltages V1 and V2. V1 and V2 can be single-ended or fully differential signals, and therefore the transconductors can be single ended or fully differential.

This implementation of the averaging function has several advantages over the prior art averaging circuits using passive components as illustrated in FIGS. 1A, 1B. First, the circuit amplifies the averaged signal which improves resolution and noise performance. Second, the circuit provides an active drive which increases the speed of the circuit.

Figure 3:
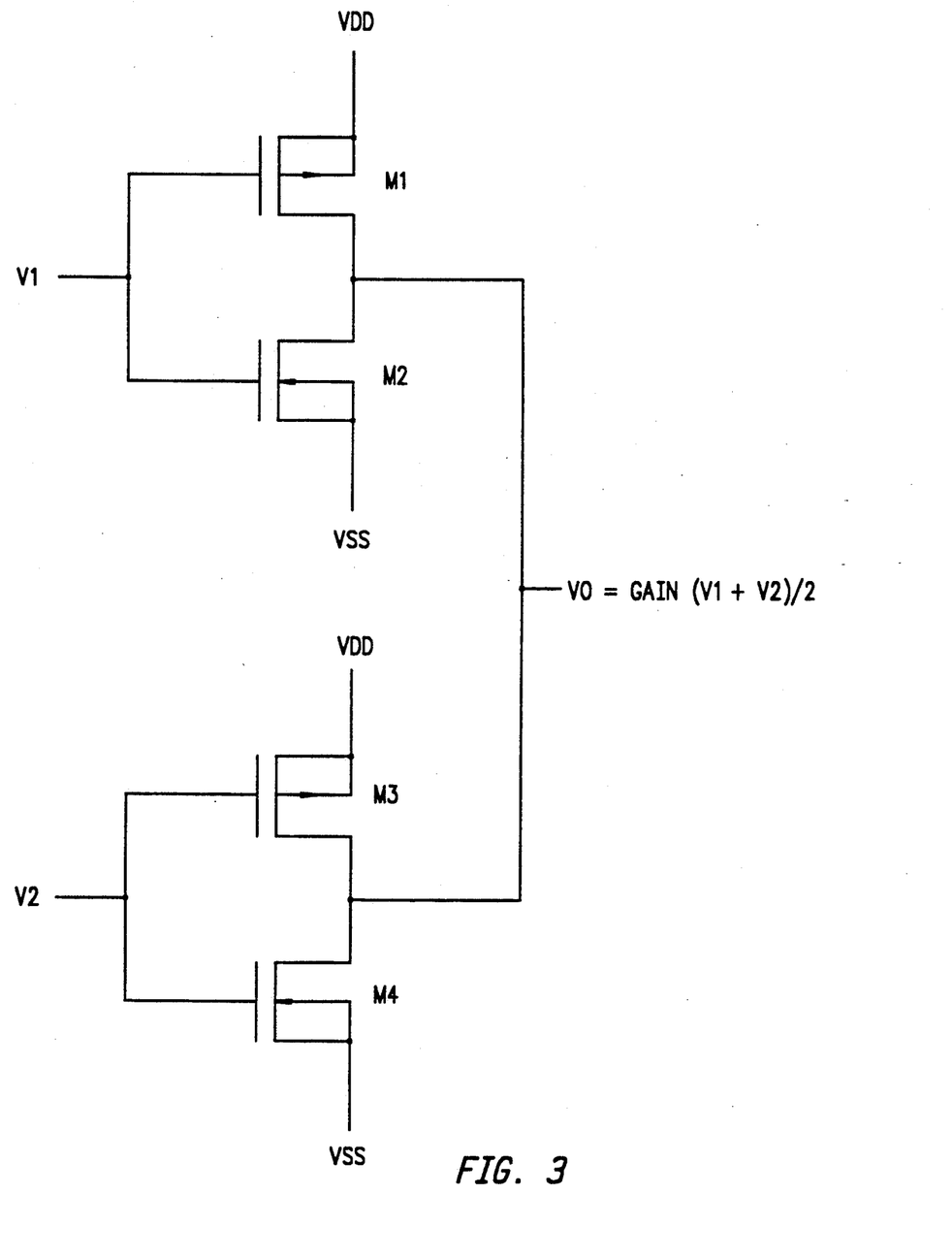
FIG. 3 is a schematic of the analog averaging circuit of FIG. 2 using CMOS inverters in accordance with one embodiment of the invention.

The analog averaging circuit in accordance with the invention can use active components other than inverters and can be implemented using several known technologies including bipolar, MOS, and CMOS. FIG. 3 is a schematic of one embodiment of the analog averaging circuit of FIG. 2 using CMOS inverters. One inverter includes the CMOS transistor pair M1 and M2 which are serially connected between positive and negative DC voltage supplies, VDD and VSS. The first input signal, V1, is applied to the gates of transistors M1 and M2, and an output is taken at the common drain terminal of the two transistors. Similarly, the second inverter includes CMOS transistor pair M3 and M4 which are serially connected between the positive and negative voltage potentials, VDD and VSS. The second input signal, V2, is applied to the gates of transistors M3 and M4, and the output is taken at the common drain terminal of transistors M3 and M4. The outputs are then connected to provide the averaging circuit output. Assuming that the transistors and the two inverters have the same gain, the output is given as $$V0 = \text{gain}(V1+V2)/2.$$

As long as V1, V2 and V0 maintain the Mosfet transistors in the same region of operation, the linearity of the averaging function will be maintained. However, if these voltages change to a level which puts any one of the four Mosfet transistors (M1, M2, M3, M4) into a different region of operation the averaging function will become non-linear. For example, if M1 is in the triode region and M1, M3 and M4 are in the saturation region, the output will be non-linear.

Figure 4:
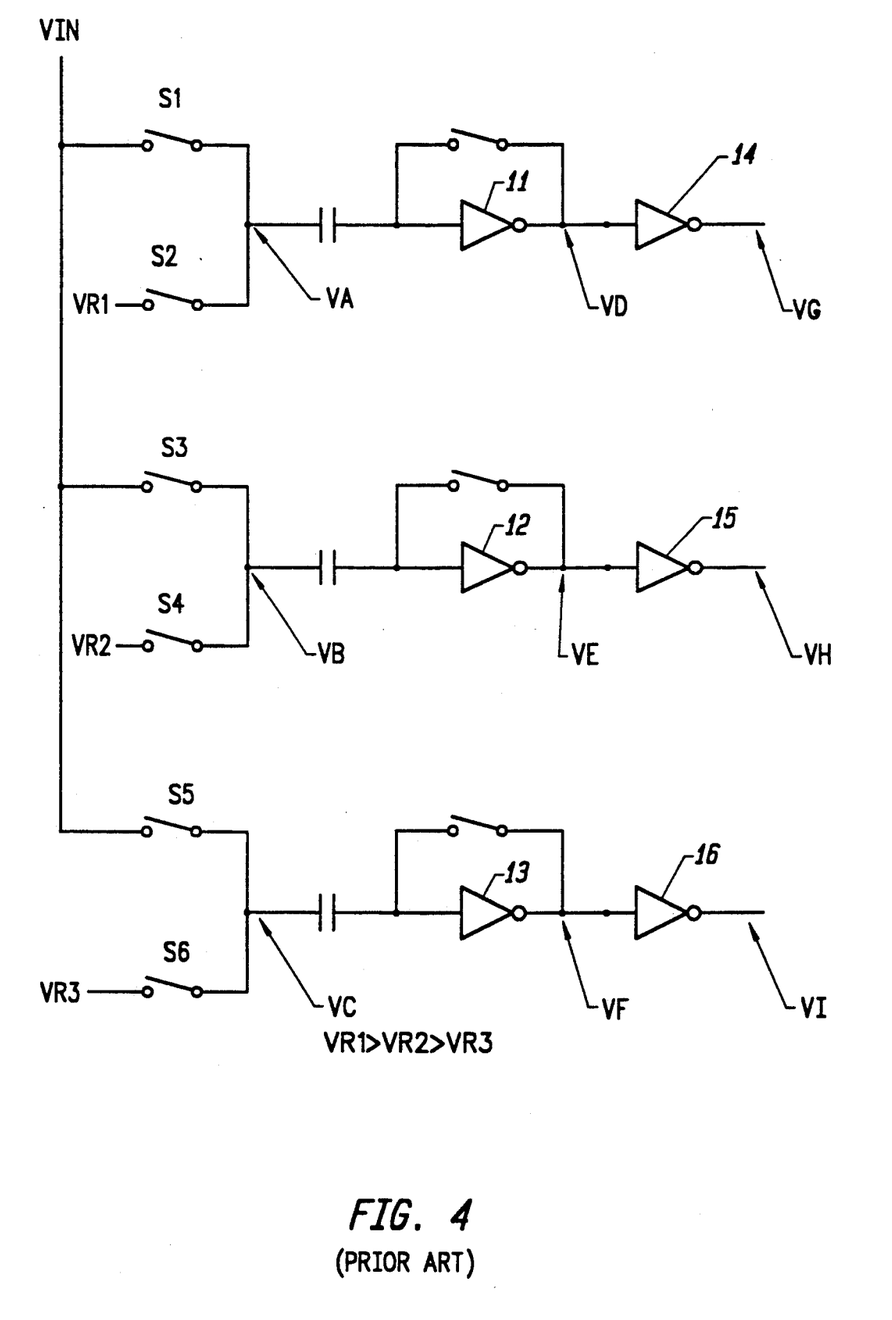
FIG. 4 is a schematic of a conventional flash converter subsection.

In accordance with the invention a useful application of the active analog averaging circuit is in flash analog to digital converters. FIG. 4 is a schematic of a conventional flash converter subsection. VR1, VR2, and VR3 are precision voltages all equally spaced by 1 LSB (which is $\frac{1}{2}^N$) times the reference voltage. VIN is the analog input voltage. Switches S1 and S2 along with the capacitor C1 are toggled to provide a voltage difference to inverter I1. The amplified output voltage, VD, is applied to inverter I4 which provides output VG. Similarly, switches S3, S4 and capacitor C2 provide a voltage difference to inverter I2 with the amplified output voltage, VE, applied to a second inverter I5 which provides an output VH. Switches S5, S6 and capacitor C3 provide a difference or residue voltage between VIN and the third reference VR3 which is applied to inverter I3. The amplified output of inverter I3 is then applied to inverter I6 which provides the third output VI.

In this conventional circuit, the outputs VG, VH, and VI are all determined independently. With proper switch control. If VIN is greater than VR1, then VG=VH=VI=(logic low) value. If VR1 is greater than VIN which is greater than VR2, then VG=(logic high) and VH=VI=(logic low). If VR2 is greater than VIN which is greater than VR3, then VG=VH=(logic high), and VI=(logic low). If VR3 is greater than VIN, then VG=VH=VI=(logic high). This assumes that the inverters, I1, I2, I3 match perfectly, inverters I4, I5, I6 match perfectly, and the capacitors C1, C2 and C3 match perfectly. However, in actual implementations these devices will not match perfectly due to random processing variations. Mismatches of any of these devices can cause an error to be made when determining the range in which VIN falls.

Figure 5:
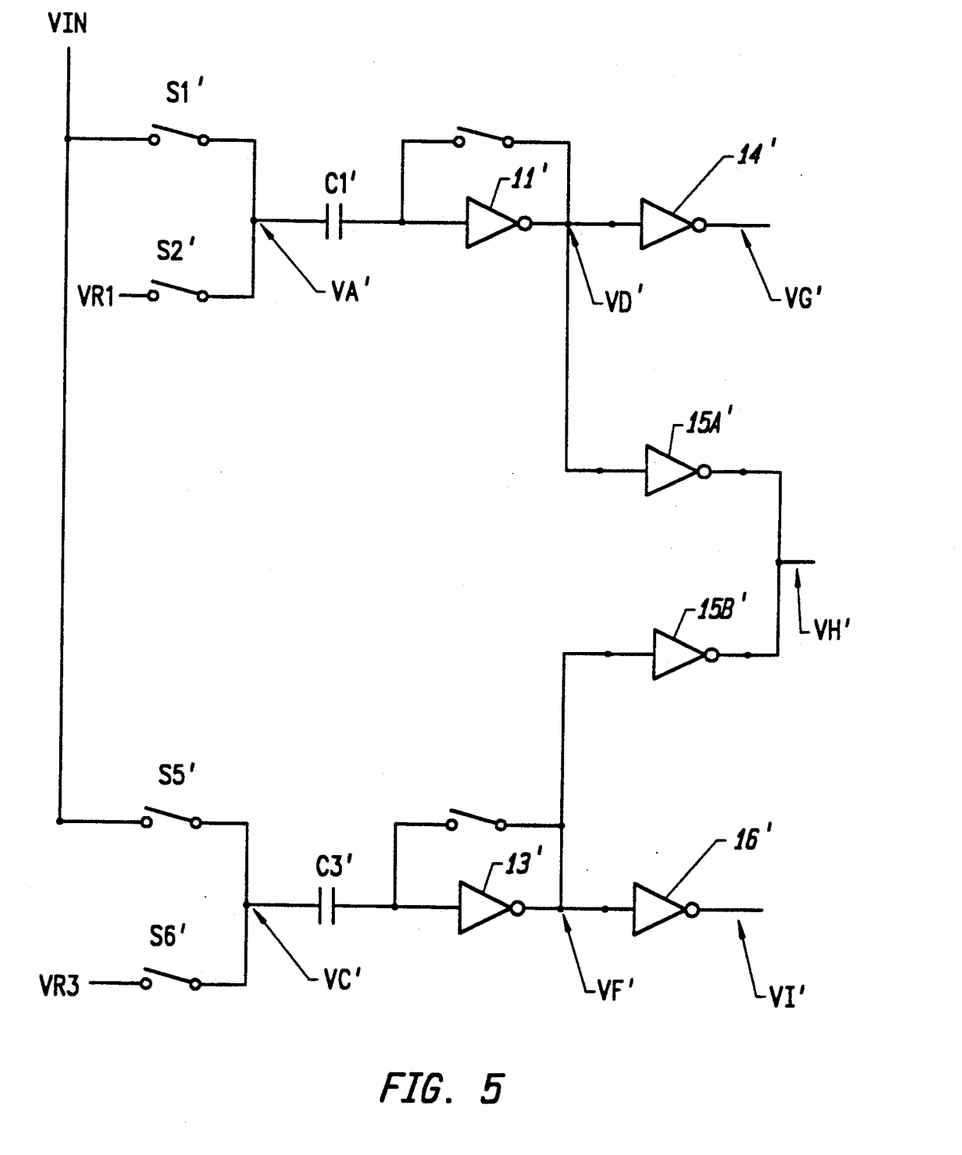
FIG. 5 is a schematic of a flash converter section using the analog averaging device of FIG. 2 in accordance with one embodiment of the invention.

FIG. 5 is a schematic of a flash converter subsection using the active analog averaging circuit in accordance with the invention. In this circuit only two reference voltages, VR1 and VR3, are required with the circuit independently determining the outputs VG' and VI', as in the circuit of FIG. 4. However, the output VH1 is determined based on the VG' and VI' signal paths by averaging the voltages VD' and VF' using the active analog averaging circuit including inverters 15A' and 15B' in accordance with the circuit of FIG. 2. If VIN is greater than VR1, then VG'=VH'=VI'=(logic low). If VR1 is greater than VIN which is greater than VR2, then VG'=(logic high) and VH'=VI'=(logic low). If VR2 is greater than VIN which is greater than VR3, then VG'=VH'=(logic high), and VI'=(logic low). If VR3 is greater than VIN, then VG'=VH'=VI'=(logic high).

The flash converter subcircuit using active analog averaging significantly reduces the sensitivity of the VIN range decision to reference errors and offset mismatches. First, since the averaging circuit determines VH' based on the VG' and VI' signal paths, errors in the VG' and VI' signal paths are reduced by a factor of 2. Further, since the difference between VR1 and VR3 is 2 LSBS, the resolution requirement on I1' and I3' is reduced by a factor of 2. Therefore, the resolution capability of the averaging circuit is twice that of the standard implementation of FIG. 4. Additionally, the averaging circuit has a speed advantage. Since the input minimum signal level required in order for the circuit to give the correct output is twice as large as the for the conventional implementation, the averaging circuit is faster.

Figure 6:
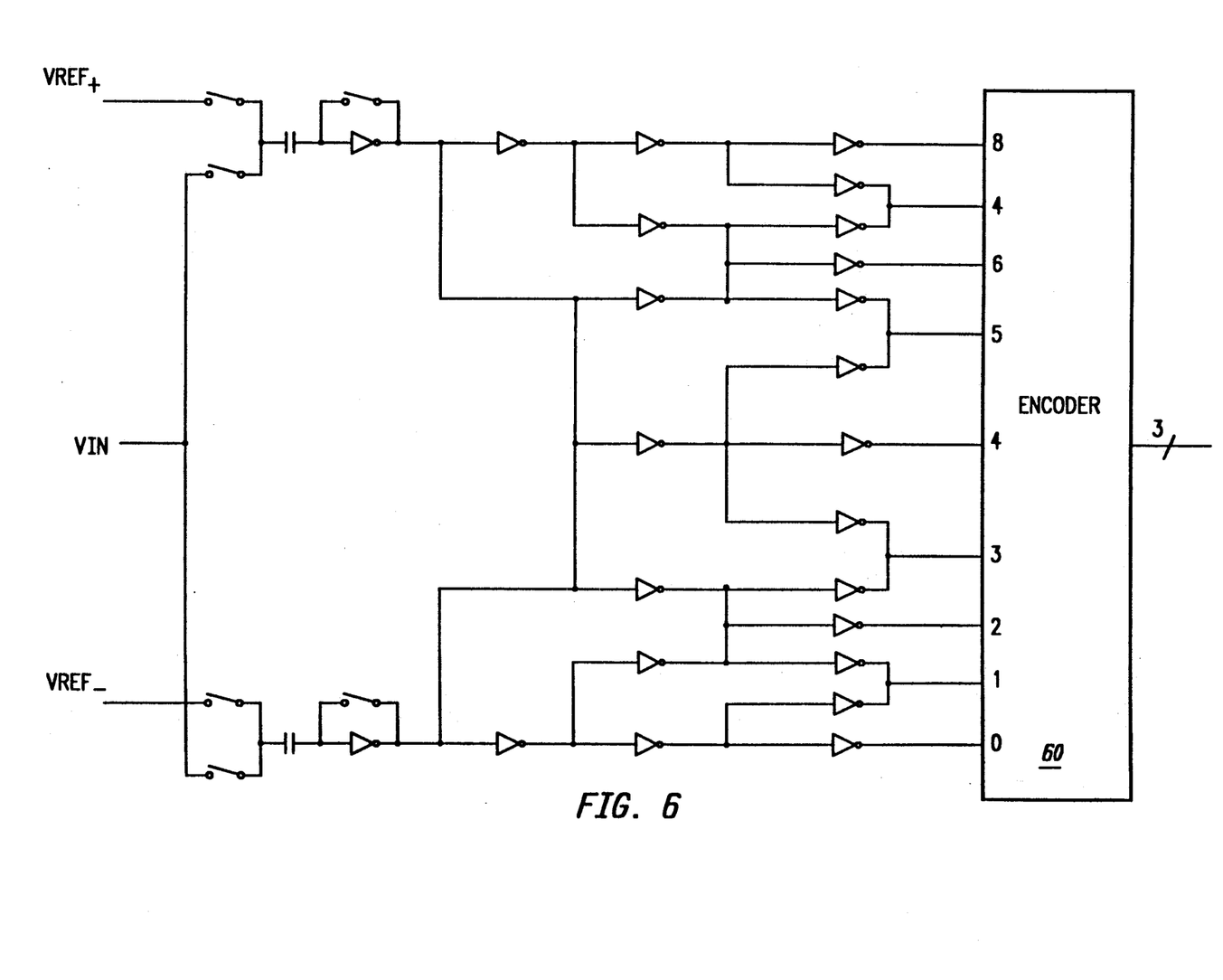
FIG. 6 is a schematic of a 3 bit flash converter employing active averaging in accordance with another embodiment of the invention.

The flash converter subcircuit using active averaging can be extended further as shown in the 3 bit flash converter subsection shown in FIG. 6. Only two reference voltages (VREF+ and VREF−) are required in obtaining the 9 inputs to the 3 bit encoder 60. The inputs 0 and 8 are obtained independently and directly from the two reference voltages as described in FIGS. 4 and 5. Input 4 is derived by averaging voltages in the circuit paths for the inputs 0 and 8. Similarly, input 6 is derived by averaging a voltage in the path for input 4 and a voltage in the path for input 8, and input 2 is derived by averaging a voltage from the circuit path for input 4 and a voltage in the circuit path for input 0. The inputs 1, 3, 5, and 7 are similarly obtained by averaging of voltages from 2 circuit paths.

The 3 bit flash converter subsection of FIG. 6 has a number of advantages over the conventional full parallel flash converter. Fewer comparator taps are required which significantly reduces the transient signals at the analog input and at the reference voltage taps. This also reduces the number of precision voltage taps required which leads to a significant reduction in silicon area and improved accuracy. Fewer comparator elements are required than in the standard implementation, and the reduced number of gain elements further reduces the required silicon area and power requirements. Since the circuit uses the comparator gain elements as linear gain elements to amplify an effective residue voltage, the comparator elements always process a signal much larger than 1 LSB. This significantly increases speed and accuracy of the converter.

Figure 7:
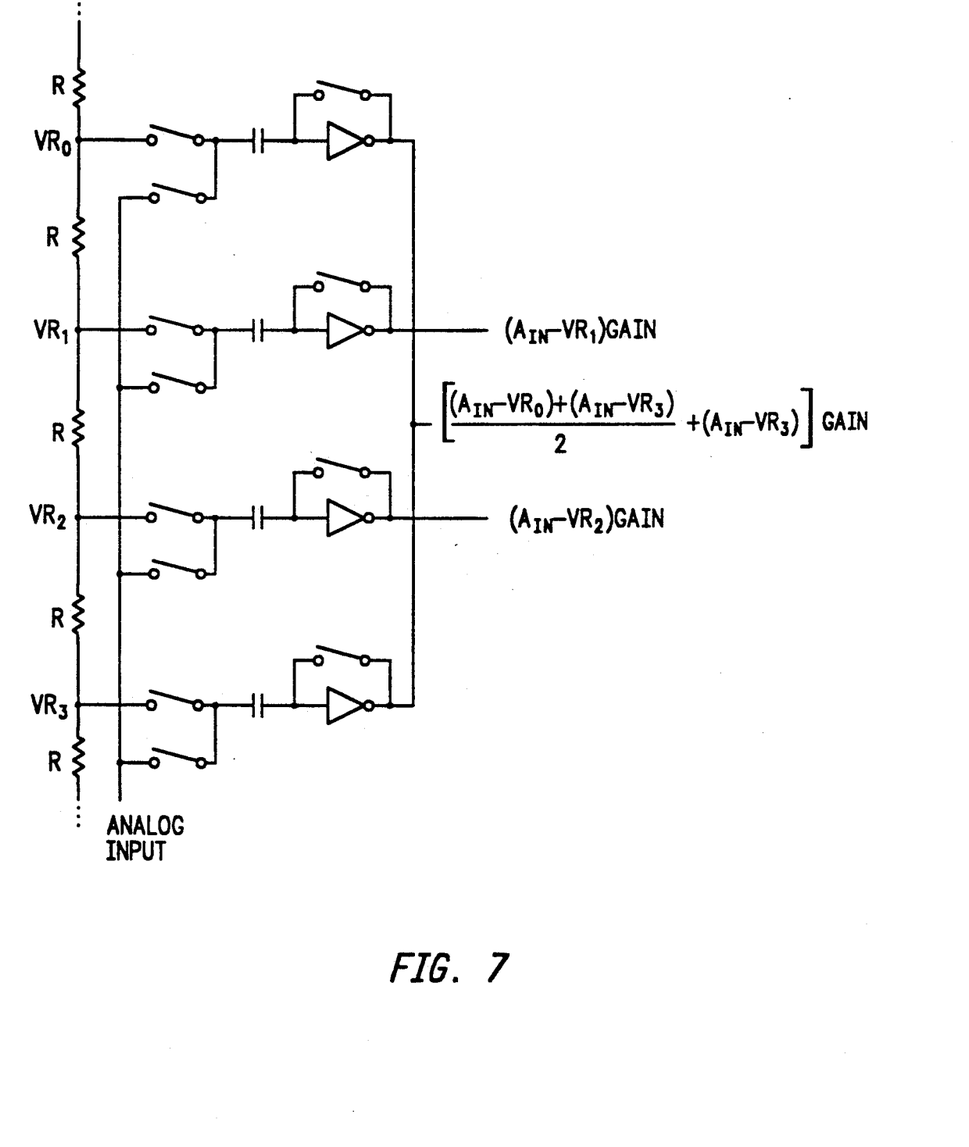
FIG. 7 is a schematic of another embodiment of a flash converter using the analog averaging device of FIG. 2.

The circuit of FIG. 7 provides another method of improving the speed and accuracy of the active averaging circuit. In order to average between $V_{R1}$ and $V_{R2}$, the voltages $V_{R0}$ and $V_{R3}$ are used which give a larger voltage drive to the active transductors which increases the speed and accuracy of the averaging circuit. In essence $V_{R0}$ and $V_{R3}$ are scaled versions of $V_{R1}$ and $V_{R2}$ respectively, centered around the mid-voltage, $(V_{R1}+V_{R2})/2$. Therefore, $$(V_{R0}+V_{R3})/2=(V_{R1}+V_{R2})/2$$

Figure 8A:
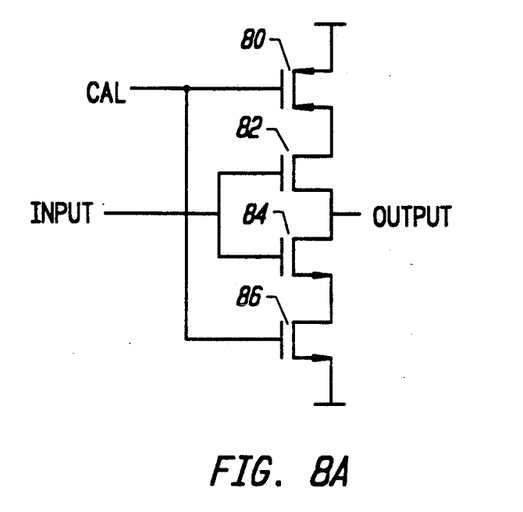
FIG. 8A is a schematic of a calibrated inverter useful in the invention.
Figure 8B:
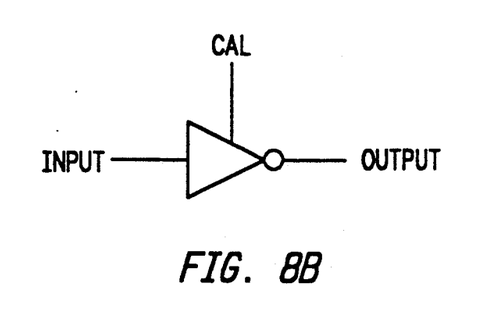
FIG. 8B is a symbolic representation thereof.

FIG. 8A is a schematic of a transconductor which can be used in the invention to increase the accuracy of the averaging by incorporating calibration. In FIG. 8A, PMOS transistor 80 and NMOS transistor 86 are variable voltage controlled resistors for the inverter transistors 82, 84. The gates of transistors 80, 86 are connected to the calibration voltage, CAL, and the gates of inverter transistors 82, 84 are connected to the input. The output is taken at the common drain connection of transistors 82, 84. Thus the calibration voltage, CAL, adjusts the transfer characteristics from the input to the output of the transconductor. FIG. 8B is a symbolic representation of the calibrated transconductor.

While the invention has been described with reference to specific embodiments, the description is illustrative of the invention and is not to be construed as limiting the invention. As noted above, various active elements can be used for the inverters, and different circuit technologies including CMOS can be employed. Thus, various modifications and applications may occur to those skilled in the art without departing from the true spirit and scope of the invention as defined by the appended claims.

What is claimed is:

1. An active analog averaging circuit comprising:
   a first transconductance device having an input, an output, and a first transconductance gain value,
   a second transconductance device having an input, an output, and a second transconductance gain value,
   means for connecting a first analog input signal to said input of said first transconductance device,
   means for connecting a second analog input signal to said input of said second transconductance device, and
   means coupling said outputs for producing a gained average value of said input signals.

2. The circuit as defined by claim 1 wherein said first and second transconductance devices are CMOS inverters.

3. The circuit as defined by claim 2 wherein each CMOS inverter comprises an NMOS transistor and a PMOS transistor having gate electrodes connected in common, drain electrodes connected in common, and source electrodes connected to first and second DC voltage supplies.

4. The circuit as defined by claim 3 and further including a third active analog averaging circuit receiving said second residue signal and said first intermediate residue level and producing a third intermediate residue level.

5. The circuit as defined by claim 3 wherein said first transconductance gain value is equal to said second transconductance gain value and said gained average value is the average of said first analog input signal and said second analog input signal times the gain value.

6. The circuit as defined by claim 3 wherein said first transconductance gain value is unequal to said second transconductance gain value and said gained average value is a weighted gained average value.

7. The circuit as defined by claim 1 wherein said first transconductance gain value is equal to said second transconductance gain value and said gained average value is the average of said first analog input signal and said second analog input signal times the gain value.

8. The circuit as defined by claim I wherein said first transconductance gain value is not equal to said second transconductance gain value and said gained average value is a weighted gained average value.

9. The circuit as defined by claim 1 wherein said first analog input signal and said second analog input signal are scaled versions of third and fourth analog signals, respectively and the output is the gained average of said third and fourth analog signals.

10. The circuit as defined by claim 1 wherein said first transconductance gain value and said second transconductance gain value are calibrated.

11. The circuit as defined by claim 10 wherein each of said first transconductance device and said second transconductance device comprises a first CMOS transistor pair with a second CMOS transistor pair serially connected therewith as variable voltage controlled resistors.

12. The circuit as defined by claim 1 wherein said first and second transconductance devices are fully differential and said gained average value is fully differential.

13. The circuit as defined by claim 1 wherein said first and second transconductance devices are fully differential and said gained average value is single ended.

14. An N bit analog to digital converter circuit comprising:
   first input means for receiving an analog signal and a first reference signal and producing a first residue signal,
   a second input means for receiving said analog signal and a second reference signal and producing a second residue signal,
   a first active analog averaging circuit receiving said first residue signal and said second residue signal and producing a gained average value of said first and second residue signals, said gained averaged value representing a first intermediate residue level.

15. The converter circuit as defined by claim 14 wherein said active analog averaging circuit comprises:
   a first transconductance device having an input, an output, and a first transconductance gain value,
   a second transconductance device having an input, an output, and a second transconductance gain value,
   means for connecting a first analog input signal to said input of said first transconductance device,
   means for connecting a second analog input signal to said input of said second transconductance device, and
   means coupling said outputs for producing a gained average value of said input signals.

16. The converter circuit as defined by claim 4& wherein said first and second transconductance devices are CMOS inverters.

17. The converter circuit as defined by claim wherein each CMOS inverter comprises an NMOS transistor and a PMOS transistor having gate electrodes connected in common, drain electrodes connected in common, and source electrodes connected to first and second DC voltage supplies.

18. The converter circuit as defined by claim 17 wherein said first transconductance gain value is equal to said second transconductance gain value and said gained average value is the average of said first analog input signal and said second analog input signal times the gain value.

19. The converter circuit as defined by claim 14 and further including a second active analog averaging circuit receiving said first residue signal and said first intermediate residue level and providing a second intermediate residue level.

* * * * *

UNITED STATES PATENT AND TRADEMARK OFFICE
CERTIFICATE OF CORRECTION

PATENT NO. : 5,298,814
DATED : March 29, 1994
INVENTOR(S) : JOHN CARUSO

It is certified that error appears in the above-indentified patent and that said Letters Patent is hereby corrected as shown below:

ON THE TITLE PAGE:

The inventors should be:

--John Caruso, Fremont, California; Roger A. Levinson, San Francisco, California; Jose A. Salcedo, Livermore, California; Ali Tasdighi, San Jose, California.--

IN THE DRAWINGS:

Fig. 7, the output of the circuit should be:

$$-- \left[ \frac{(A_{IN}-VR_0) - (A_{IN}-VR_3)}{2} + (A_{IN}-VR_3) \right] GAIN --$$

Signed and Sealed this

Fourth Day of October, 1994

*Attest:*

BRUCE LEHMAN

*Attesting Officer*     *Commissioner of Patents and Trademarks*